(12) United States Patent
Ikeda (10) Patent No.: US 9,165,999 B2
(45) Date of Patent: Oct. 20, 2015

(54) NITRIDE SEMICONDUCTOR DEVICE

(71) Applicant: Kabushiki Kaisha Toshiba, Tokyo (JP)

(72) Inventor: Kentaro Ikeda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 13/785,301

(22) Filed: Mar. 5, 2013

(65) Prior Publication Data
US 2013/0248933 A1 Sep. 26, 2013

(30) Foreign Application Priority Data
Mar. 23, 2012 (JP) .................................. 2012-068381

(51) Int. Cl.
*H01L 29/06* (2006.01)
*H01L 29/778* (2006.01)
*H01L 29/872* (2006.01)
*H01L 29/20* (2006.01)

(52) U.S. Cl.
CPC ........ *H01L 29/0619* (2013.01); *H01L 29/7786* (2013.01); *H01L 29/872* (2013.01); *H01L 29/2003* (2013.01)

(58) Field of Classification Search
CPC ...................... H01L 29/2003; H01L 29/66462; H01L 29/7787; H01L 21/02458; H01L 21/0254; H01L 21/66; H01L 27/04
USPC .................................................. 257/193–194
See application file for complete search history.

(56) References Cited

U.S. PATENT DOCUMENTS

| 6,855,970 | B2 * | 2/2005 | Hatakeyama et al. | 257/264 |
| 2006/0131685 | A1 * | 6/2006 | Watanabe et al. | 257/483 |
| 2010/0123186 | A1 * | 5/2010 | Ohta et al. | 257/329 |
| 2011/0260216 | A1 * | 10/2011 | Hebert | 257/194 |

FOREIGN PATENT DOCUMENTS

JP 2007-165804 6/2007

OTHER PUBLICATIONS

Office Action issued Apr. 21, 2014 in Japanese Patent Application No. 2012-068381 with English language translation.

* cited by examiner

*Primary Examiner* — David Vu
*Assistant Examiner* — Jonathan Han
(74) *Attorney, Agent, or Firm* — Oblon, McClelland, Maier & Neustadt, L.L.P.

(57) ABSTRACT

According to one embodiment, a nitride semiconductor device including a device region and a guard ring formation region surrounding the device region, the nitride semiconductor device includes a first nitride semiconductor layer provided in the device region and the guard ring formation region; a second nitride semiconductor layer provided on the first nitride semiconductor layer and forming a hetero-junction with the first nitride semiconductor layer; and a shielding layer provided on the second nitride semiconductor layer in the guard ring formation region and electrically protecting the device region. A two-dimensional electron gas is present near an interface between the first nitride semiconductor layer and the second nitride semiconductor layer within the first nitride semiconductor layer below the shielding layer, and the shielding layer is in ohmic contact with the two-dimensional electron gas.

19 Claims, 10 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2012-068381, filed on Mar. 23, 2012; the entire contents of which are incorporated herein by reference.

FIELD

Embodiments described herein relate generally to a nitride semiconductor device.

BACKGROUND

A nitride semiconductor has a feature that it has a high breakdown voltage, a low resistance, and a high speed operation in comparison with a silicon semiconductor. For example, in a nitride semiconductor-based transistor having a hetero-structure called a High Electron Mobility Transistor (HEMT), a two-dimensional electron gas is formed in a hetero-junction portion. The two-dimensional electron gas has high electron mobility and a high electron density. Therefore, it is possible to fabricate a device that has a low resistance and a high speed when the nitride semiconductor is used. This enables the device to be downsized and a parasitic capacitance within the device to be reduced. However, when the parasitic capacitance is reduced, there are problems in that static electricity is not absorbed within the device and a resistance of the device against the static electricity is decreased.

DETAILED DESCRIPTION

In general, according to one embodiment, a nitride semiconductor device including a device region and a guard ring formation region surrounding the device region, the nitride semiconductor device includes a first nitride semiconductor layer provided in the device region and the guard ring formation region; a second nitride semiconductor layer provided on the first nitride semiconductor layer and forming a hetero-junction with the first nitride semiconductor layer; and a shielding layer provided on the second nitride semiconductor layer in the guard ring formation region and electrically protecting the device region. A two-dimensional electron gas is present near an interface between the first nitride semiconductor layer and the second nitride semiconductor layer within the first nitride semiconductor layer below the shielding layer, and the shielding layer is in ohmic contact with the two-dimensional electron gas.

Hereinafter, embodiments will be described with reference to drawings. In the description below, the same components are denoted with the same symbols, and the repeated explanation of the components that have already been described is appropriately omitted.

First Embodiment

Figure 1:
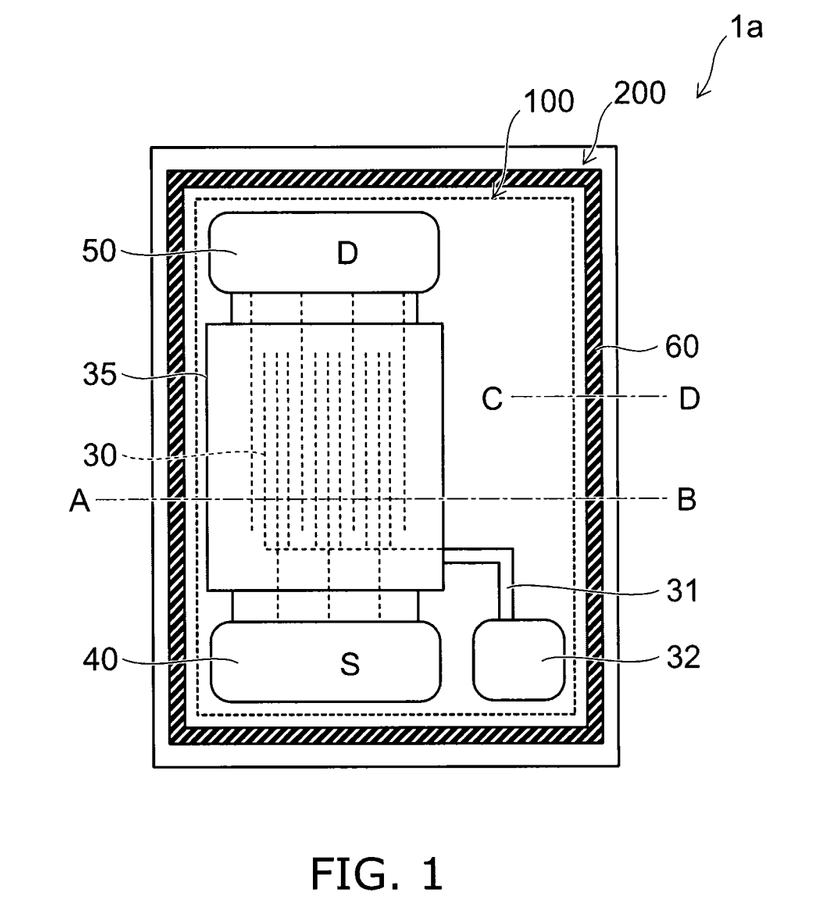
FIG. 1 is a schematic plan view illustrating a nitride semiconductor device according to a first embodiment.

FIG. 1 is a schematic plan view illustrating a nitride semiconductor device according to a first embodiment.

Figure 2A:
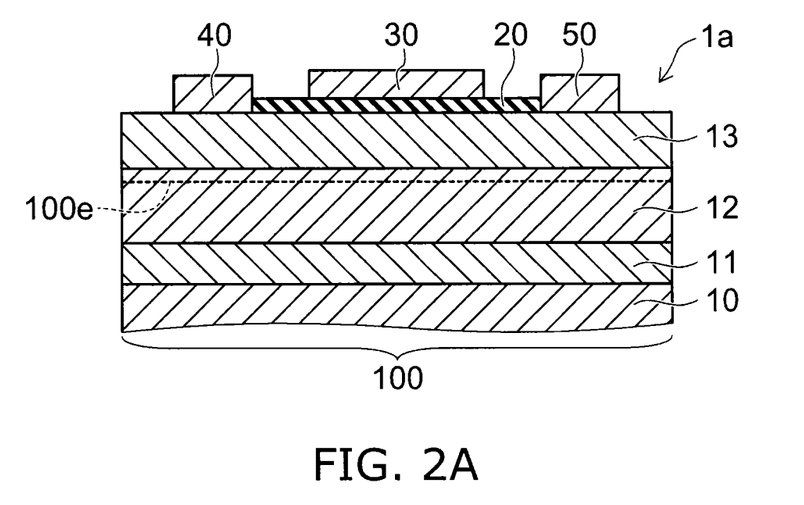
FIGS. 2A and 2B are schematic cross-sectional views illustrating the nitride semiconductor device according to the first embodiment.
Figure 2B:
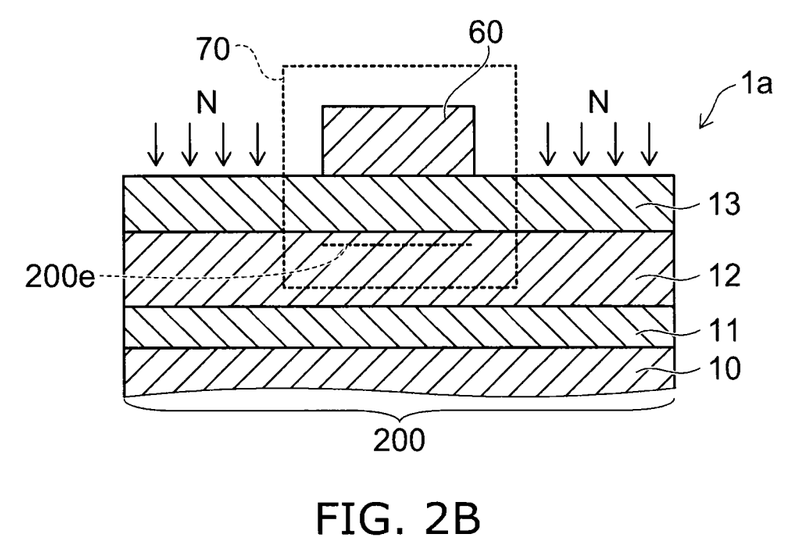

FIGS. 2A and 2B are schematic cross-sectional views illustrating the nitride semiconductor device according to the first embodiment, wherein FIG. 2A is a schematic cross-sectional view in an A-B position of FIG. 1, and FIG. 2B is a schematic cross-sectional view in a C-D position of FIG. 1. In addition, in FIG. 2A, a set of a source, a drain, and a gate is only shown in the A-B cross-section (this is also the same as the A-B cross-section of other transistors).

A nitride semiconductor device 1a shown in FIG. 1 and FIGS. 2A and 2B is an HEMT. The nitride semiconductor device 1a has a device region 100, and a guard ring formation region 200 provided around the device region 100 and surrounding the device region 100. The nitride semiconductor device is includes a substrate 10 provided in the device region 100 and the guard ring formation region 200, and a buffer layer 11 provided on the substrate 10. The source, the gate, and the drain that form the transistor are formed in the device region 100. The guard ring formation region 200 electrically protects the device region 100 and a periphery of the device region. In addition, the nitride semiconductor device 1a includes a GaN-containing layer (first nitride semiconductor layer) disposed in the device region 100 and the guard ring formation region 200, and a barrier layer (second nitride semiconductor layer) 13 provided on the GaN-containing layer 12 and forms a hetero-junction with the GaN-containing layer 12.

The device region 100 shown in FIG. 2A will be described. In the device region 100, a Two Dimensional Electron Gas (2DEG) 100e is generated in the vicinity of an interface between the GaN-containing layer 12 and the barrier layer 13 within the GaN-containing layer 12. The 2DEG has high electron mobility and a high electron density. The GaN-containing layer 12 functions as a carrier running layer.

A gate insulating film 20 is provided on the barrier layer 13. A gate electrode 30 is provided on the gate insulating film 20. The gate electrode 30 controls a current flowing between source and drain electrodes. The gate electrode 30 is connected to a gate interconnection 31 in the device region 100, and the gate interconnection 31 is also connected to a gate electrode pad 32. In addition, a source electrode 40 in ohmic contact with the barrier layer 13 and a drain electrode 50 in ohmic contact with the barrier layer 13 are provided in the device region 100.

The guard ring formation region 200 shown in FIG. 2B will be described.

A shielding layer 60 electrically protecting the device region 100 is provided on the GaN-containing layer 12 in the guard ring formation region 200. The shielding layer 60 is in ohmic contact with the barrier layer 13. A 2DEG 200e is present in the vicinity of an interface between the GaN-containing layer 12 and the barrier layer 13 within the GaN-containing layer 12 below the shielding layer 60. The shielding layer 60 is in ohmic contact with the 2DEG 200e. That is, the shielding layer 60 and the 2DEG 200e are electrically connected. The shielding layer 60 and the 2DEG 200e are used as a guard ring 70. In the nitride semiconductor device 1a, the device region 100 is surrounded by the guard ring 70.

In the guard ring formation region 200, the 2DEG 200e is broken and is not present within the GaN-containing layer 12 other than the GaN-containing layer just below the shielding layer 60. For example, nitrogen (N), argon (Ar), boron (B), iron (Fe), carbon (C), phosphorus (P), or the like is introduced in the vicinity of the interface between the GaN-containing layer 12 and the barrier layer 13 in portions other than the portion just below the shielding layer 60, and the 2DEG 200e is thus suppressed from being generated. The introduction of these elements is carried out, for example, by ion implantation.

Regions in which the 2DEGs 100e and 200e are not formed are referred to as isolation regions in a plane of the nitride semiconductor device 1a. In addition, a region surrounded by the reference numeral 35 is referred to as an FET active region 35.

The substrate 10 is any one of an Si substrate, an SiC substrate, and a sapphire substrate. The buffer layer 11 includes GaN or AlGaN. The barrier layer 13 includes non-doped or n-type $Al_xGa_{1-x}N$ ($0<X\le1$) or $In_yAl_{1-y}N$ ($0<Y\le1$).

A material of the gate insulating film 20 is any one of a silicon nitride film ($Si_3N_4$), a silicon oxide film ($SiO_2$), and an aluminum oxide ($Al_2O_3$). The gate electrode 30 may have a Metal-Insulator-Semiconductor (MIS) structure as shown in the drawing, or may be formed of a material forming a Schottky junction with the barrier layer 13 without the gate insulating film 20. The source electrode 40 and the drain electrode 50 include, for example, Ti, Al, or the like. A material of the shielding layer 60 may be the same as the material of the source and drain electrodes. This causes a dedicated manufacturing process forming the shielding layer 60 to be unnecessary, so that the number of the manufacturing processes is not increased.

Operations of the nitride semiconductor device 1a will be described.

A plane size of the nitride semiconductor device 1a is, for example, 1 square mm. The nitride semiconductor device 1a is formed by separately cutting out each of a plurality of the nitride semiconductor devices 1a formed on a surface of a semiconductor wafer in a dicing process. After the cutting out is carried out, the individual nitride semiconductor devices 1a may be carried by a pickup or the like. In the dicing process and the carrying process, static electricity (static charges) may enter from a side surface of the nitride semiconductor device 1a.

In the nitride semiconductor device 1a, the shielding layer 60 in the guard ring 70 shields the static electricity even when the static electricity enters from the side surface of the nitride semiconductor device 1a. This enables the device surface inside from the shielding layer 60 to be reliably protected from the static electricity.

In addition, in the nitride semiconductor device 1a, the 2DEG 200e below the shielding layer 60 functions as a part of the guard ring 70. This enables the 2DEG 200e in the guard ring 70 to shield the static electricity even when the static electricity enters from the side surface of the nitride semiconductor device 1a. Therefore, the nitride semiconductor layer inside from the 2DEG 200e is reliably protected from the static electricity.

For example, a height of the 2DEG 100e from the substrate 10 in the device region 100 is the same as a height of the 2DEG 200e from the substrate 10 in the guard ring formation region 200. Therefore, the hetero-junction surface of the device region 100 is reliably protected from the static electricity by the 2DEG 200e.

In this manner, a potential inside the guard ring 70 becomes equipotential even when the static electricity enters from the side surface of the nitride semiconductor device 1a, and the electrostatic discharge failure of the device region 100 can thus be prevented from occurring in advance.

In addition, in the nitride semiconductor device 1a, the shielding layer 60 and the 2DEG 200e are used as the guard ring 70, and an effect (shielding range) of shielding the static electricity is thus further increased in comparison with a method of using only the shielding layer 60 as the guard ring.

In addition, in the nitride semiconductor device 1a, since the shielding layer 60 and the 2DEG 200e are electrically connected, it is not necessary to bury the shielding layer 60 up to the hetero-junction surface.

In a hetero-structure such as a GaN-based or InAlN-based hetero-structure, in a case of a material with which it is difficult to freely form a p-type semiconductor, a permissible amount against a transient overvoltage called avalanche resistance is small, a parasitic capacitance is small, and a permissible amount against the static electricity is more and more decreased. In particular, the small parasitic capacitance causes the permissible amount against the static electricity of the gate to be decreased and also causes formation of a diode for protecting the gate used often in an Si-based transistor to be difficult in the hetero-structure such as the GaN-based or InAlN-based structure, and an impact on the gate reliability due to the static electricity thus becomes outstanding. As a countermeasure against this, the device may be designed so as to increase the parasitic capacitance of the transistor or the diode. However, there is a problem that a high speed operation can not be realized.

On the other hand, in the first embodiment, the nitride semiconductor device 1a is realized by suppressing the parasitic capacitance from being increased, enabling the high speed operation, and thus having a high resistance against the static electricity.

Second Embodiment

Figure 3A:
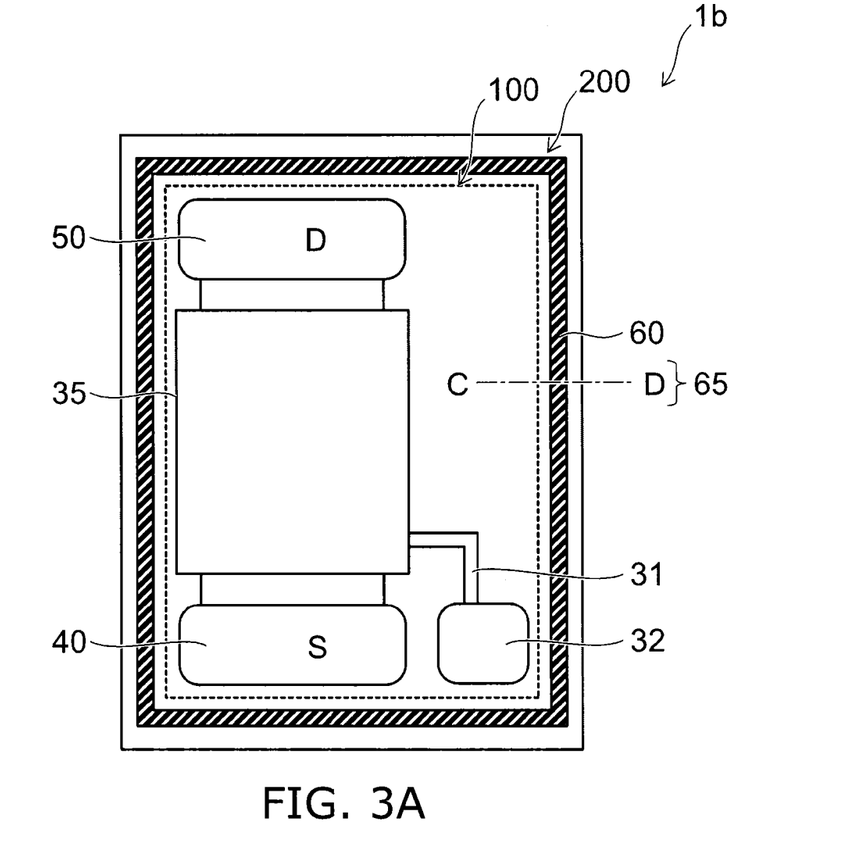
FIGS. 3A and 3B are schematic views illustrating a nitride semiconductor device according to a second embodiment.
Figure 3B:
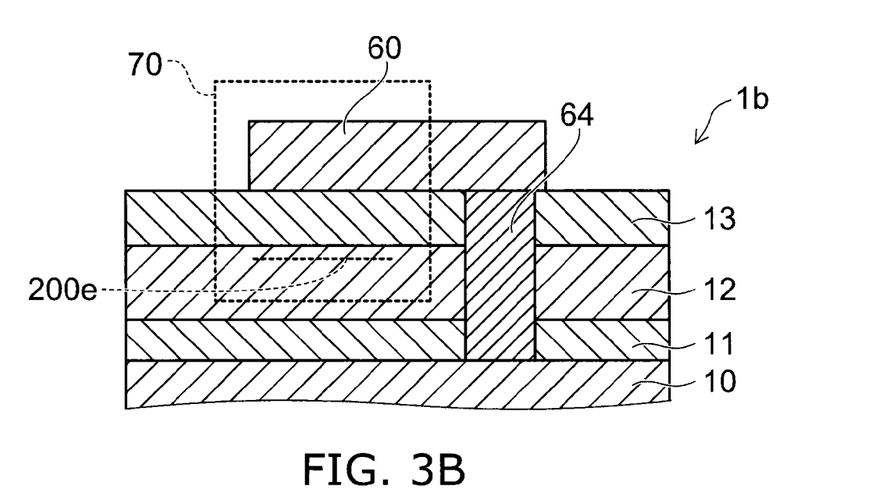

FIGS. 3A and 3B are schematic views illustrating a nitride semiconductor device according to a second embodiment, wherein FIG. 3A is a schematic plan view, and FIG. 3B is a schematic cross-sectional view in a C-D position of FIG. 3A.

A nitride semiconductor device 1b shown in FIGS. 3A and 3B is an HEMT. In the nitride semiconductor device 1b, a conductive substrate is used as a substrate 10 supporting a GaN-containing layer 12. That is, a mother substrate of an epitaxial substrate for forming the nitride semiconductor device is a conductive substrate. The conductive substrate is, for example, an Si substrate, an SIC substrate, or the like. A potential of the substrate 10 may be a ground potential.

In addition, the nitride semiconductor device 1b includes a via 64 in which a shielding layer 60 is provided within a buffer layer 11, within the GaN-containing layer 12, and within a barrier layer 13. In the nitride semiconductor device 1b, the shielding layer 60 is electrically connected to the substrate 10 through the via 64 in which the shielding layer 60 is provided within the buffer layer 11, within the GaN-containing layer 12, and within the barrier layer 13. The via 64 may be provided in an entire area below the shielding layer 60, or may be provided in a part of the area below the shielding layer 60, that is, only in a region 65 shown in the drawing. In other words, the via 64 is provided below at least a part of the shielding layer 60. In addition, when the via 64 is disposed in the part of the area below the shielding layer 60, the via is not limited to only the region 65 shown in the drawing, and may be disposed in any position below the shielding layer 60.

In addition, since a 2DEG 200e is electrically connected to the shielding layer 60, the 2DEG 200e is also electrically connected to the substrate 10 through the via 64 provided within the buffer layer 11, within the GaN-containing layer 12, and within the barrier layer 13.

According to the nitride semiconductor device 1b, a side surface (guard ring 70 or via 64) and a bottom surface (substrate 10) of the nitride semiconductor device 1b become equipotential. The guard ring 70 and the substrate 10 shield the static electricity even when the static electricity enters from the side surface and the bottom surface of the nitride semiconductor device 1b. Therefore, an effect of shielding the static electricity in the nitride semiconductor device 1b is further enhanced in comparison with the nitride semiconductor device 1a.

Third Embodiment

Figure 4:
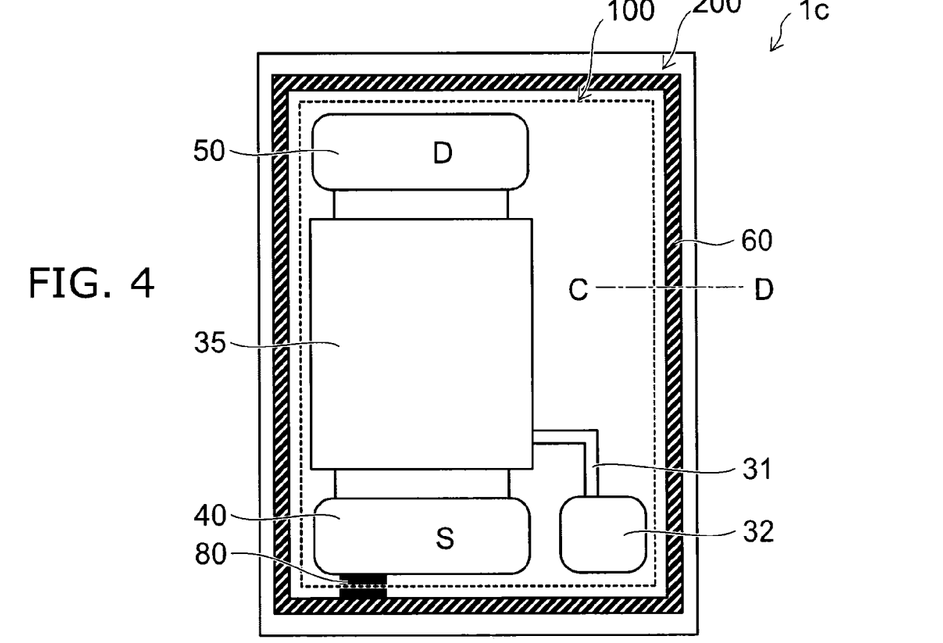
FIG. 4 is a schematic plan view illustrating a nitride semiconductor device according to a third embodiment.

FIG. 4 is a schematic plan view illustrating a nitride semiconductor device according to a third embodiment.

A nitride semiconductor device 1c shown in FIG. 4 is an HEMT. In the nitride semiconductor device 1c, a shielding layer 60 penetrates an interconnection 80 to be electrically connected to a source electrode 40.

According to the nitride semiconductor device 1c, a guard ring 70 and a transistor become equipotential. This enables a device region 100 to be protected from accumulated charges occurring in the process of manufacturing the nitride semiconductor device, which is known as an antenna effect. A position in which the interconnection 80 is disposed is not limited to the position shown.

Fourth Embodiment

Figure 5:
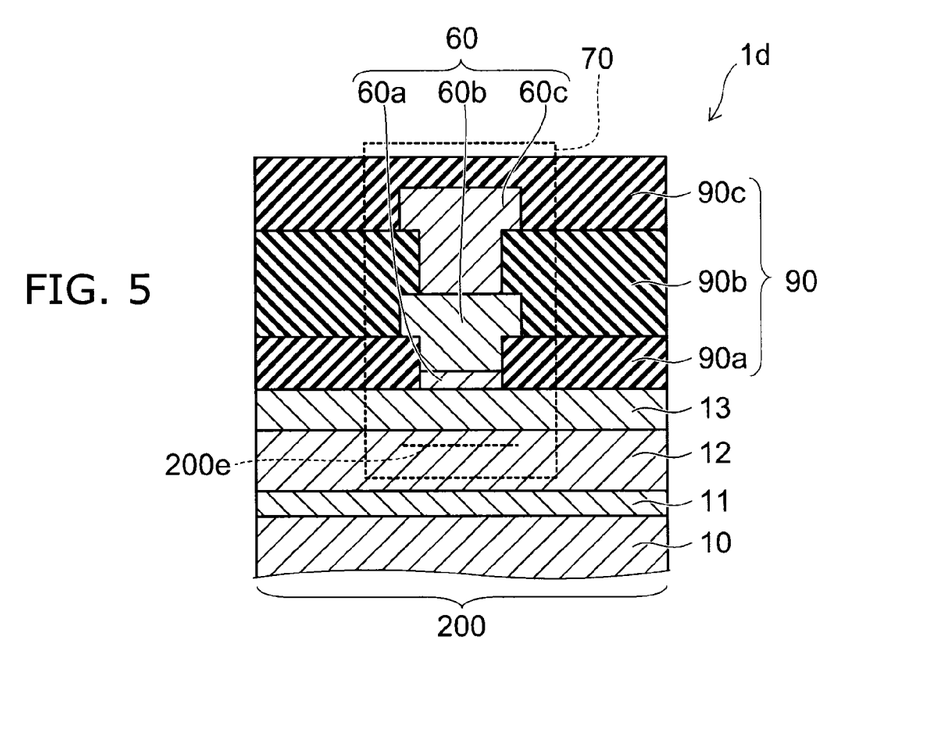
FIG. 5 is a schematic cross-sectional view illustrating a nitride semiconductor device according to a fourth embodiment.

FIG. 5 is a schematic cross-sectional view illustrating a nitride semiconductor device according to a fourth embodiment.

In FIG. 5, a cross-section of a nitride semiconductor device 1d in the guard ring formation region 200 is shown. The nitride semiconductor device 1d shown in FIG. 5 is an HEMT.

In the nitride semiconductor device 1d, a shielding layer 60 has a three-layer structure. The shielding layer 60 has a stacked structure in which a contact layer 60a, an intermediate layer 60b, and a top layer 60c are stacked from a surface of a substrate 10. The contact layer 60a is a stacked film in which, for example, Ti and Al are sequentially stacked from the surface of the substrate 10. The intermediate layer 60b includes, for example, Au, Al, Cu, or the like. The top layer 60c includes, for example, Au, Al, Cu, or the like.

In addition, the nitride semiconductor device 1d further includes an insulating film 90 covering the shielding layer 60. The insulating film 90 includes, for example, $SiO_2$. The insulating film 90 has a stacked structure in which a first insulating film 90a, a second insulating film 90b, and a third insulating film 90c are stacked from the surface of the substrate 10.

After the nitride semiconductor device 1d shown in FIG. 5 is manufactured, a wire bonding process may be carried out on the nitride semiconductor device 1d. In the wire bonding process, a bonding wire is connected to, for example, an electrode outside a package or the like from the electrode of the transistor.

When the insulating film 90 covering the shielding layer 60 is not provided, discharge may occur between the bonding wire and the shielding layer 60 in the wire bonding process. According to the nitride semiconductor device 1d, since the shielding layer 60 is covered by the insulating film 90, the discharge can be prevented from occurring in advance. Therefore, the reliability of the nitride semiconductor device 1d after the wire bonding process is enhanced.

Fifth Embodiment

Figure 6:
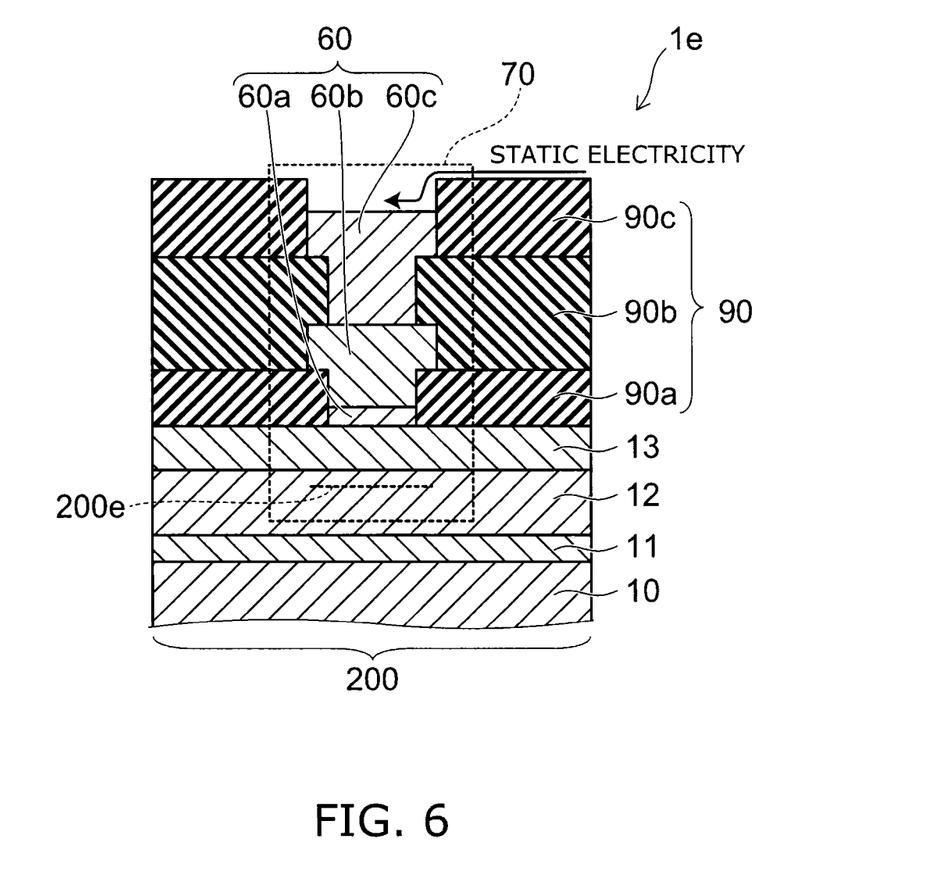
FIG. 6 is a schematic cross-sectional view illustrating a nitride semiconductor device according to a fifth embodiment.

FIG. 6 is a schematic cross-sectional view illustrating a nitride semiconductor device according to a fifth embodiment.

A cross-section of a nitride semiconductor device 1e in a guard ring formation region 200 is shown in FIG. 6. The nitride semiconductor device 1e shown in FIG. 6 is an HEMT. In the nitride semiconductor device 1e, at least a part of a surface (surface of a top layer 60c) of a shielding layer 60 is exposed from an insulating film 90.

According to the nitride semiconductor device 1e, static electricity is made to pass through the guard ring 70 in advance even when the static electricity enters a device region 100 along a surface of the insulating film 90. When the static electricity reaches the guard ring 70, the static electricity is shielded by the guard ring 70. Therefore, the device region 100 is reliably protected from the static electricity in the nitride semiconductor device 1e.

Sixth Embodiment

Figure 7A:
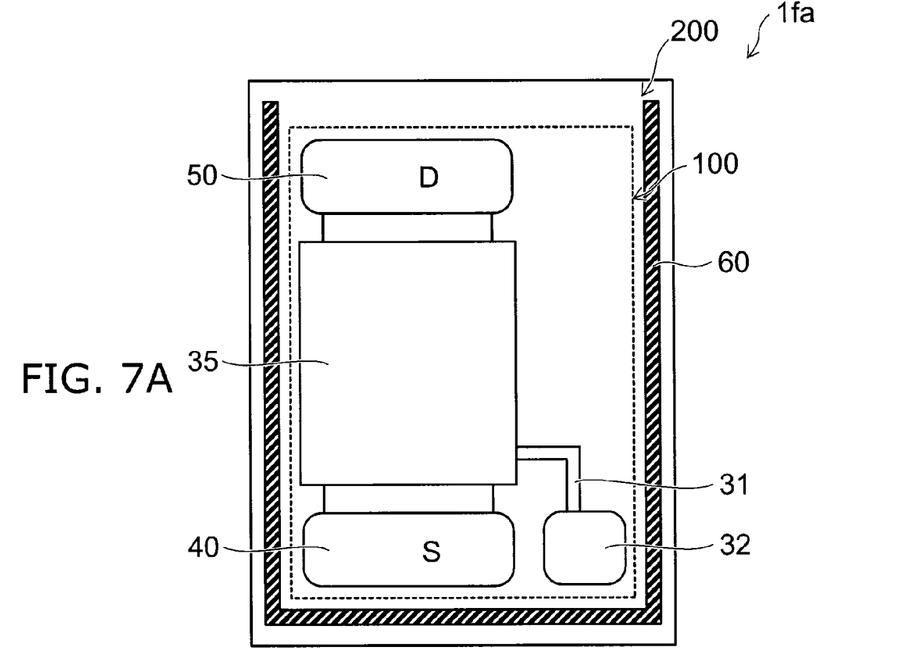
FIGS. 7A and 7B are schematic plan views illustrating nitride semiconductor devices according to a sixth embodiment.
Figure 7B:
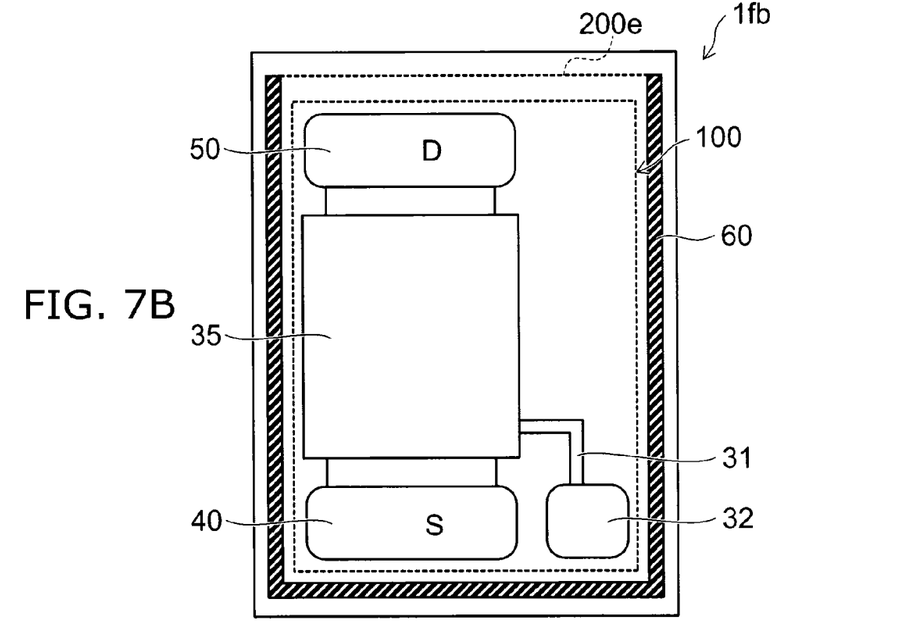

FIGS. 7A and 7B are schematic plan views illustrating nitride semiconductor devices according to a sixth embodiment, wherein FIG. 7A is a schematic plan view illustrating a first example of the sixth embodiment, and FIG. 7B is a schematic plan view illustrating a second example of the sixth embodiment. Nitride semiconductor devices 1fa and 1fb shown in FIGS. 7A and 7B are HEMTs.

In the nitride semiconductor device 1fa shown in FIG. 7A, a part of a shielding layer 60 is cut to be noncontiguous. In addition, a 2DEG is not present below a portion in which the part of the shielding layer 60 is noncontiguous. That is, in the nitride semiconductor device 1fa, the part of the shielding layer 60 and the part of the 2DEG are noncontiguous, and a part of a guard ring 70 becomes noncontiguous.

As described above, in the wiring bonding process, the discharge may occur between the bonding wire and the guard ring 70. In the nitride semiconductor device 1fa, the guard ring 70 is made to avoid the position in which danger such as the discharge is likely to occur and is disposed in a portion other than the position in which the guard ring is removed. Accordingly, danger such as the discharge is avoided and the shielding effect on the static electricity is maintained.

For example, in the nitride semiconductor device 1fa, the guard ring 70 is not disposed near an electrode such as a drain electrode 50 to which a high voltage is applied, and the guard ring 70 is disposed near a source electrode to which a low voltage is applied in comparison with the drain electrode 50. Therefore, it is possible to avoid an electric short between the electrode to which the high voltage is applied and the guard ring 70 and also to reliably protect a device region 100 from the static electricity.

In addition, in the nitride semiconductor device 1*fb* shown in FIG. 7B, only the part of a shielding layer 60 is noncontiguous, and a 2DEG 200*e* remains below the noncontiguous part. Such structure is also included in the embodiment.

In this case, the danger such as the discharge described above is avoided and a shielding effect on the static electricity is maintained by the 2DEG 200*e*.

Seventh Embodiment

Figure 8A:
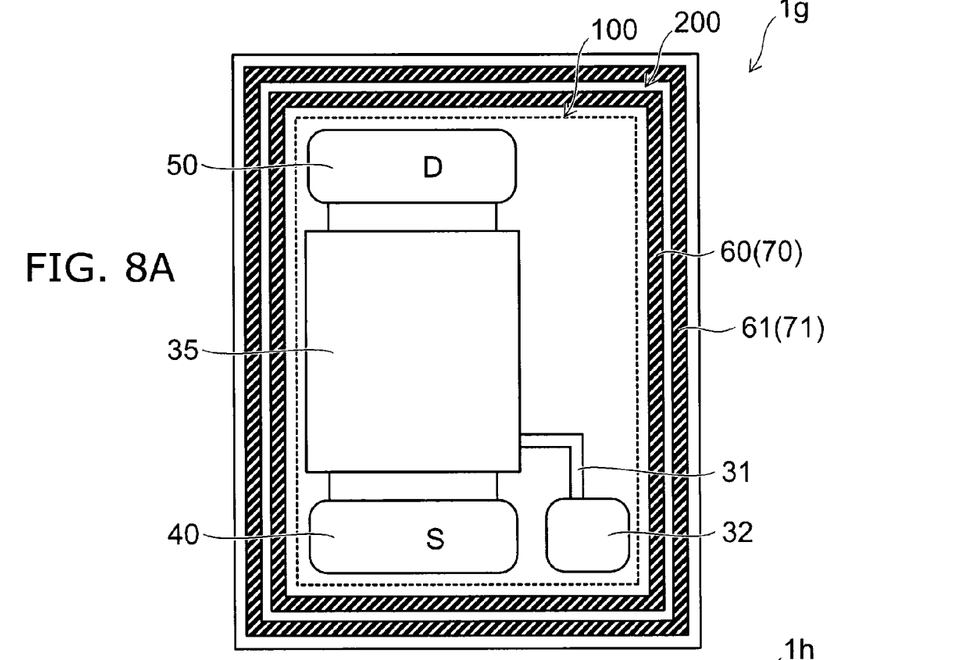
FIGS. 8A and 8B are schematic plan views illustrating nitride semiconductor devices according to a seventh embodiment.
Figure 8B:
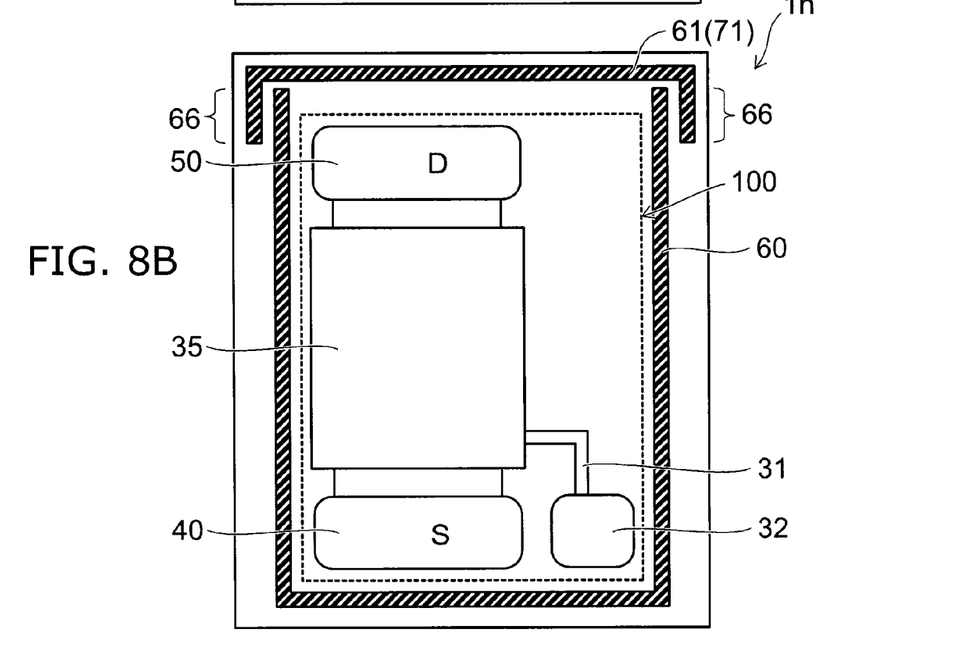

FIGS. 8A and 8B are schematic plan views illustrating nitride semiconductor devices according to a seventh embodiment, wherein FIG. 8A is a schematic plan view showing a state in which a shielding layer is multiply disposed, and FIG. 8B is a schematic plan view showing a state in which a part of a shielding layer in FIG. 8A becomes noncontiguous.

Nitride semiconductor devices 1*g* and 1*h* shown in FIGS. 8A and 8B are HEMTs.

The nitride semiconductor device 1*g* shown in FIG. 8A further includes an another shielding layer 61 from a shielding layer 60 in a guard ring formation region 200. The shielding layer 61 is provided in the guard ring formation region 200 that is an opposite side of the device region 100 of the shielding layer 60. The shielding layer 60 is surrounded by the shielding layer 61. The shielding layer 61 is in ohmic contact with the barrier layer 13.

A 2DEG is present near an interface between the GaN-containing layer 12 and the barrier layer 13 within the GaN-containing layer 12 below the shielding layer 61. The shielding layer 61 is in ohmic contact with the 2DEG. The shielding layer 61 and the 2DEG are used as a guard ring 71. The guard ring 71 surrounds the guard ring 70. That is, when the nitride semiconductor device 1*g* is seen from a direction perpendicular to a main surface of the substrate 10, the shielding layer 60 is surrounded by the shielding layer 61 and the 2DEG present below the shielding layer 61. In addition, the guard rings are disposed doubly in a guard ring formation region 200. The number of the guard rings to be disposed in the guard ring formation region 200 is not limited to the number shown in the drawing, and may be three or more.

According to the nitride semiconductor device 1*g*, the guard rings are multiply disposed and thus a device region can be reliably protected from static electricity.

In the nitride semiconductor device 1*h* shown in FIG. 8B, a part of each of guard rings 70 and 71 is cut and noncontiguous. In FIG. 8B, a state in which a part of a shielding layer 60 and a part of the shielding layer 61 are noncontiguous is shown. When the part of the shielding layer 61 is noncontiguous, a part of the 2DEG below the part of the shielding layer may be noncontiguous.

When a range in which the guard ring 70 and the guard ring 71 overlap each other is a range 66, the shielding layer 61 in the range 66 is provided in the guard ring formation region 20 that is an opposite side of the device region 100 of the shielding layer 60. That is, in the guard ring formation region 200, at least a part of the shielding layer 61 is provided on an opposite side of at least a part of the shielding layer 60.

As described above, in the wire bonding process, the discharge between the bonding wire and the guard ring 70 may occur. In the nitride semiconductor device 1*h*, the guard rings 70 and 71 are not disposed in the position in which danger such as the discharge is likely to occur while the shielding effect on the static electricity is maintained by the guard rings 70 and 71 in a portion other than the position in which the guard rings are not disposed.

In addition, in the nitride semiconductor device 1*h*, the guard rings are not disposed doubly in the portion other than the range 66. Therefore, the parasitic capacitance between electrodes of the transistor caused by the disposed guard ring is reduced in comparison with the nitride semiconductor device 1*g*.

In addition, in the nitride semiconductor device 1*h*, the guard ring 71 is disposed near the electrode such as a drain electrode 50 to which a high voltage is applied, and the guard ring 70 is disposed near a source electrode to which a low voltage is applied in comparison with the drain electrode 50. That is, the guard rings are divided and disposed near the electrode to which the high voltage is applied and near the electrode to which the low voltage is applied.

Since the guard ring 71 is disposed outward farther than the guard ring 70, a distance between the drain electrode 50 and the guard ring 71 is longer than a distance between the source electrode 40 and the guard ring 70. This enables the electric short between the electrode to which the high voltage is applied and the guard ring 70 to be avoided and also enables the device region 100 to be reliably protected from the static electricity.

Eighth Embodiment

Figure 9:
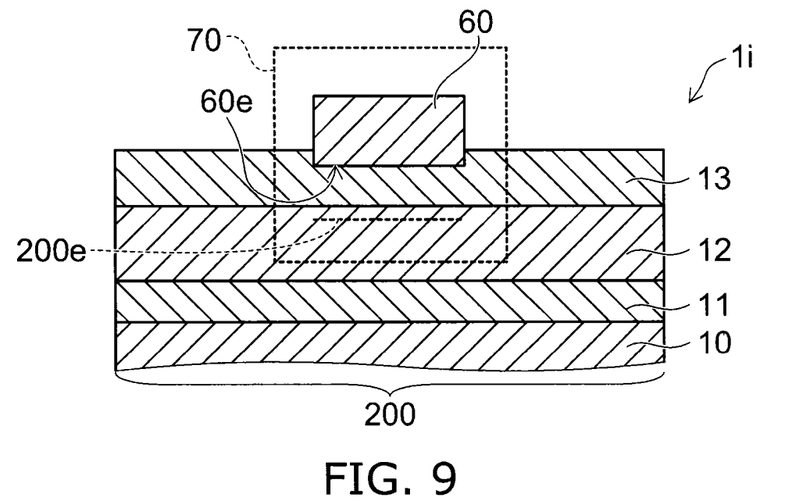
FIG. 9 is a schematic cross-sectional view illustrating a nitride semiconductor device according to an eighth embodiment.

FIG. 9 is a schematic cross-sectional view illustrating a nitride semiconductor device according to an eighth embodiment.

In FIG. 9, the cross-section of a nitride semiconductor device 1*i* in a guard ring formation region 200 is shown.

In the nitride semiconductor device 1*i*, the lower end 60*e* of the shielding layer 60 protrudes from a surface of a barrier layer 13 to an inside of the barrier layer. In other words, the lower end 60*e* of the shielding layer 60 is positioned to be lower than the surface of the barrier layer 13. Accordingly, the ohmic contact between the shielding layer 60 and a 2DEG 200*e* becomes further enhanced, and the electrical connection between the shielding layer 60 and the 2DEG becomes stronger. Therefore, the static electricity is more reliably shielded by a guard ring 70.

Ninth Embodiment

Figure 10:
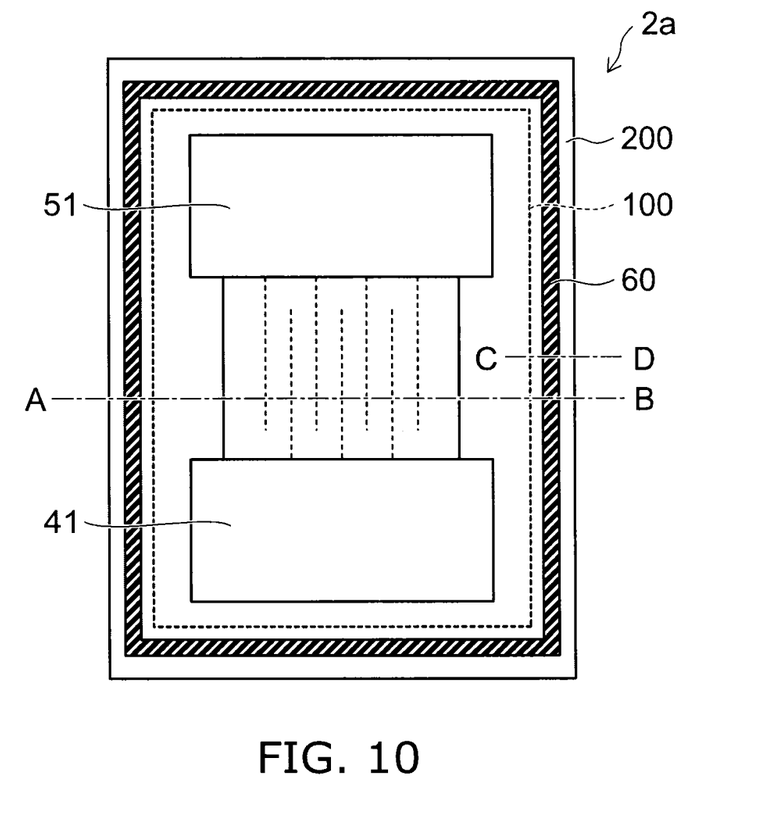
FIG. 10 is a schematic plan view illustrating a nitride semiconductor device according to a ninth embodiment.

FIG. 10 is a schematic plan view illustrating a nitride semiconductor device according to a ninth embodiment.

Figure 11A:
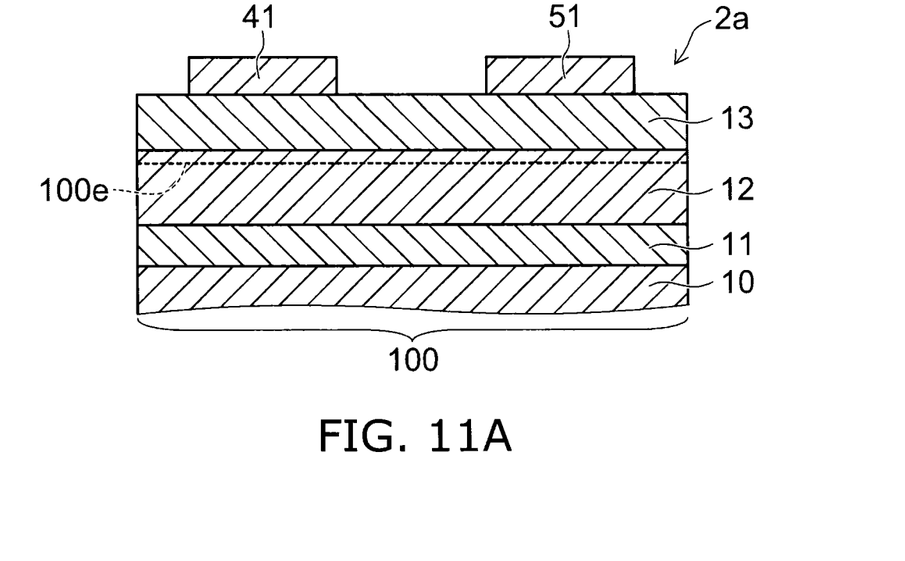
FIGS. 11A and 11B are schematic cross-sectional views illustrating the nitride semiconductor device according to the ninth embodiment.
Figure 11B:
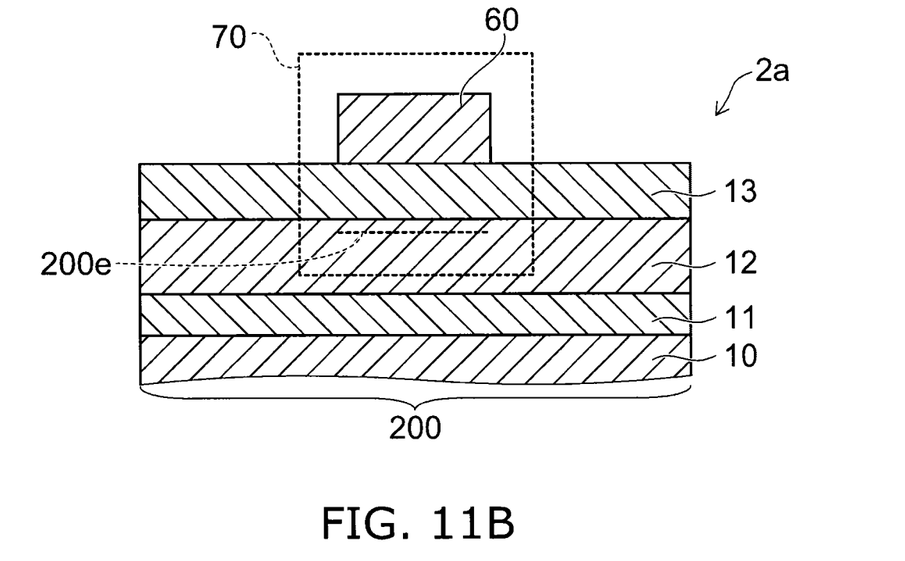

FIGS. 11A and 11B are schematic cross-sectional views illustrating the nitride semiconductor device according to the ninth embodiment, wherein FIG. 11A is a schematic cross-sectional view in the A-B position of FIG. 10, and FIG. 11B is a schematic cross-sectional view in the C-D position of FIG. 10. In addition, only a set of an anode and a cathode in the A-B cross-section of FIG. 10 is shown in FIG. 11A.

A nitride semiconductor device 2*a* shown in FIG. 10 and FIGS. 11A and 11B are a schottky diode. The nitride semiconductor device 2*a* has a device region 100, and a guard ring formation region 200 provided around the device region 100 and surrounding the device region 100. The nitride semiconductor device 2*a* includes a substrate 10 provided in the device region 100 and the guard ring formation region 200, and a buffer layer 11 provided on the substrate 10. In addition, the nitride semiconductor device 2*a* includes a GaN-containing layer 12 disposed in the device region 100 and the guard ring formation region 200, and a barrier layer 13 provided on the GaN-containing layer 12 and forming a hetero-junction with the GaN-containing layer 12.

The device region 100 shown in FIG. 11A will be described.

In the device region 100, a 2DEG 100e occurs in the vicinity of the interface between the GaN-containing layer 12 and the barrier layer 13 within the GaN-containing layer 12.

In the device region 100, an anode electrode 41 in schottky contact with the barrier layer 13, and a cathode electrode 51 in ohmic contact with the barrier layer 13 are provided.

The guard ring formation region 200 shown in FIG. 11B will be described.

In the guard ring formation region 200, a shielding layer 60 electrically protecting the device region 100 is provided on the GaN-containing layer 12. The shielding layer 60 is in ohmic contact with the barrier layer 13. A 2DEG 200e is present in the vicinity of the interface between the GaN-containing layer 12 and the barrier layer 13 within the GaN-containing layer 12 below the shielding layer 60. The shielding layer 60 is in ohmic contact with the 2DEG 200e.

That is, the shielding layer 60 and the 2DEG 200e are electrically connected. The shielding layer 60 and the 2DEG 200e are used as the guard ring 70. In the nitride semiconductor device 2a, the device region 100 is surrounded by the guard ring 70. As described above, in the guard ring formation region 200, the 2DEG 200e is destroyed to be absent within the GaN-containing layer 12 other than the GaN-containing layer just below the shielding layer 60.

The anode electrode 41 includes Ni, Au, Pt, Pd, or the like. The cathode electrode 51 includes, for example, Ti, Al, or the like. A material of the shielding layer 60 may be the same as the cathode electrode 51. Accordingly, a dedicated manufacturing process is not necessary for the shielding layer 60, and the number of manufacturing processes is not increased.

In the nitride semiconductor device 2a, the shielding layer 60 in the guard ring 70 shields the static electricity even when the static electricity enters from the side surface of the nitride semiconductor device 2a. Therefore, a surface of the device inside from the shielding layer 60 is reliably protected from the static electricity.

In addition, even when the static electricity enters from the side surface of the nitride semiconductor device 2a, the 2DEG 200e in the guard ring 70 shields the static electricity. Therefore, the nitride semiconductor layer inside from the 2DEG 200e is reliably protected from the static electricity. For example, the height of the 2DEG 100e from the substrate 10 in the device region 100 is the same as the height of the 2DEG 200e from the substrate 10 in the guard ring formation region 200. Therefore, the hetero-junction surface of the device region 100 is reliably protected from the static electricity by the 2DEG 200e.

In this manner, even when the static electricity enters from the side surface of the nitride semiconductor device 2a, the potential inside the guard ring 70 becomes equipotential, so that the electrostatic discharge failure on the device region 100 can be prevented from occurring in advance.

In the nitride semiconductor device 2a, since the shielding layer 60 and the 2DEG 200e are used as the guard ring 70, an effect of shielding the static electricity is further enhanced in comparison with the method of using only the shielding layer 60 as the guard ring.

In addition, in the nitride semiconductor device 2a, since the shielding layer 60 and the 2DEG 200e are electrically connected, it is not necessary to bury the shielding layer 60 up to the hetero-junction surface.

In the ninth embodiment, the nitride semiconductor device 2a suppressing the parasitic capacitance from being increased, enabling the high speed operation, and having a high resistance against the static electricity is realized.

Tenth Embodiment

Figure 12:
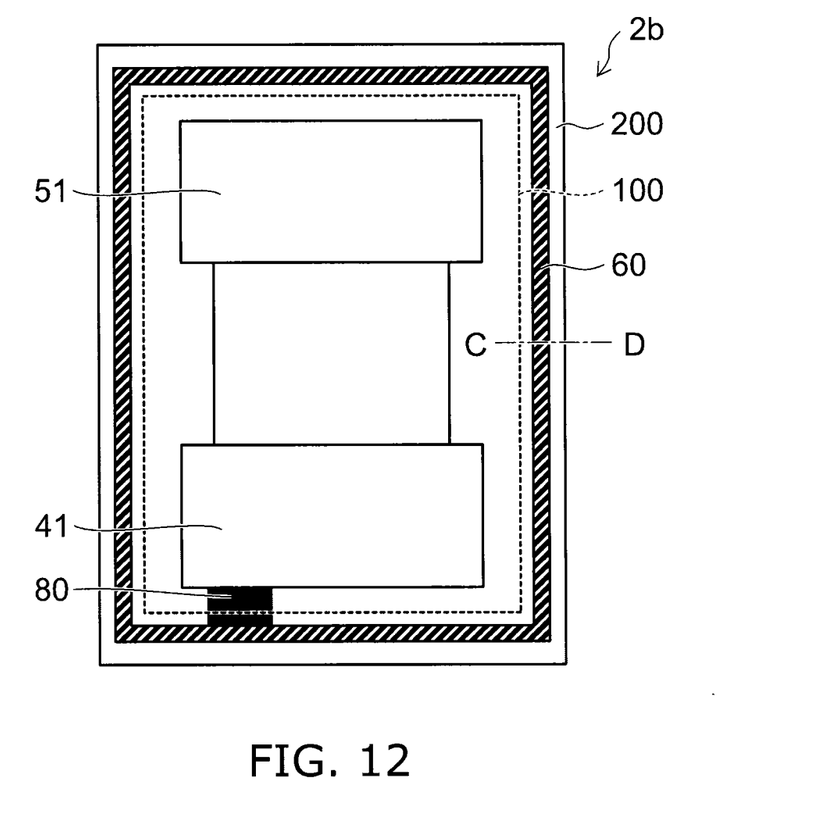
FIG. 12 is a schematic plan view illustrating a nitride semiconductor device according to a tenth embodiment.

FIG. 12 is a schematic plan view illustrating a nitride semiconductor device according to a tenth embodiment.

A nitride semiconductor device 2b shown in FIG. 12 is a Schottky diode. In the nitride semiconductor device 2b, a shielding layer 60 is electrically connected to an anode electrode 41 through an interconnection 80. The position in which the interconnection 80 is disposed is not limited to the position shown in the drawing.

According to the nitride semiconductor device 2b, a guard ring 70 and the diode become equipotential. This enables a device region 100 to be protected from accumulated charges occurring in the process of manufacturing the nitride semiconductor device, which is known as an antenna effect.

The "nitride semiconductor" in the specification includes semiconductors having all compositions in which each of the composition ratios x, y, and z within the range in the chemical formula of $B_x In_y Al_z Ga_{1-x-y-z} N$ ($0 \leq x \leq 1$, $0 \leq y \leq 1$, $0 \leq z \leq 1$, $x+y+z \leq 1$) is changed. In addition, in the above chemical formula, the composition further including group V elements other than N (nitrogen), the composition further including various elements added to control various physical properties such as a conductivity type, and the composition further including various elements that are included unintentionally are also included in the "nitride semiconductor."

The embodiments have been described with reference to the specific examples. However, the embodiments are not limited to the specific examples. That is, the specific examples to which appropriate design changes are added by those skilled in the art are also included in the range of the embodiments as long as they have the characteristics of the embodiments. Each component included in the specific examples described above and a disposition, a material, a condition, a shape, a size, or the like of the component are not limited to the illustrated examples but may be changed as appropriate.

In addition, each component included in the embodiments described above may be combined as far as it is technically possible, and the combinations thereof are also included in the range of the embodiments as long as they include the characteristics of the embodiments. In addition, it is understood by those skilled in the art that various changes and modifications are possible in the category of the spirit of the embodiments and these changes and modifications are also included in the range of the embodiments.

The embodiments have been described above with reference to examples. However, the embodiments are not limited to these examples. More specifically, these examples can be suitably modified in design by those skilled in the art. Such modifications are also encompassed within the scope of the embodiments as long as they include the features of the embodiments. The components included in the above examples and their layout, material, condition, shape, size and the like are not limited to those illustrated, but can be suitably modified.

Furthermore, the components included in the above embodiments can be combined as long as technically feasible. Such combinations are also encompassed within the scope of the embodiments as long as they include the features of the embodiments. In addition, those skilled in the art can conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
a device region;
a guard ring formation region surrounding the device region;
a first nitride semiconductor layer provided in the device region and the guard ring formation region;
a second nitride semiconductor layer provided on the first nitride semiconductor layer and forming a hetero junction with the first nitride semiconductor layer;
a source electrode provided on the second nitride semiconductor layer in the device region;
a drain electrode provided on the second nitride semiconductor layer in the device region;
a gate electrode provided on the second nitride semiconductor layer, the gate electrode being provided between the source electrode and the drain electrode; and
a shielding layer provided on the second nitride semiconductor layer in the guard ring formation region,
a two-dimensional electron gas being present near an interface between the first nitride semiconductor layer and the second nitride semiconductor layer within the first nitride semiconductor layer below the shielding layer, and
the shielding layer being in ohmic contact with the two-dimensional electron gas.

2. The device according to claim 1, wherein the device region is surrounded by the shielding layer and the two-dimensional electron gas.

3. The device according to claim 1, further comprising:
a conductive substrate supporting the first nitride semiconductor layer; and
a via provided within the first nitride semiconductor layer and within the second nitride semiconductor layer,
wherein the shielding layer is electrically connected to the conductive substrate through the via.

4. The device according to claim 3, wherein a potential of the conductive substrate is a ground potential.

5. The device according to claim 3, wherein the via is provided below at least a part of the shielding layer.

6. The device according to claim 1, wherein
the shielding layer is electrically connected to the source electrode.

7. The device according to claim 1, wherein a cathode electrode and an anode electrode are provided on the second nitride semiconductor layer in the device region, and
the shielding layer is electrically connected to the anode electrode.

8. The device according to claim 1, further comprising:
an insulating film covering the shielding layer.

9. The device according to claim 8, wherein at least a part of a surface of the shielding layer is exposed from the insulating film.

10. The device according to claim 1, wherein a part of the shielding layer or a part of the two-dimensional electron gas is noncontiguous.

11. The device according to claim 1, wherein a part of the shielding layer is noncontiguous, and the two-dimensional electron gas is present below the part of the shielding layer.

12. The device according to claim 1, further comprising:
another shielding layer different from the shielding layer in the guard ring formation region, and
another two-dimensional electron gas is present near an interface between the first nitride semiconductor layer and the second nitride semiconductor layer within the first nitride semiconductor layer below the another shielding layer,
wherein the another shielding layer is provided in the guard ring formation region on an opposite side of the device region of the shielding layer and is in ohmic contact with the another two-dimensional electron gas.

13. The device according to claim 12, wherein the shielding layer is surrounded by the another shielding layer.

14. The device according to claim 12, wherein the shielding layer is surrounded by the another shielding layer and the another two-dimensional electron gas.

15. The device according to claim 12, wherein a part of the another shielding layer or a part of the another two-dimensional electron gas is noncontiguous.

16. The device according to claim 12, wherein at least a part of the another shielding layer on an opposite side of at least a part of the shielding layer is provided in the guard ring formation region.

17. The device according to claim 1, wherein a lower end of the shielding layer is positioned on a downside of a surface of the second nitride semiconductor layer.

18. The device according to claim 1, wherein the two-dimensional electron gas is selectively present below the shielding layer.

19. The device according to claim 1, further comprising an isolation region between the device region and the guard ring formation region, the two-dimensional electron gas being present in the device region and below the shielding layer in the guard ring formation region.

* * * * *